United States Patent
Andrieu

[11] Patent Number: 5,546,317
[45] Date of Patent: Aug. 13, 1996

[54] SYSTEM FOR RECOGNIZING AND MANAGING ELECTROCHEMICAL CELLS

[75] Inventor: Xavier Andrieu, Bretigny sur Orge, France

[73] Assignee: Alcatel Alsthom Compagnine Generale d'Electricite, Paris, France

[21] Appl. No.: 238,621

[22] Filed: May 5, 1994

[30] Foreign Application Priority Data

May 6, 1993 [FR] France ..................... 93 05446

[51] Int. Cl.⁶ ........................................ H02J 7/00
[52] U.S. Cl. ............................... 364/481; 324/427
[58] Field of Search .................... 364/481, 483; 324/427, 430, 433

[56] References Cited

U.S. PATENT DOCUMENTS

| | | | |
|---|---|---|---|
| 4,016,408 | 4/1977 | Koetzle | 371/4 |
| 4,390,841 | 6/1983 | Martin et al. | 324/427 |
| 4,709,202 | 11/1987 | Koenck et al. | 320/43 |
| 4,949,046 | 8/1990 | Seyfang | 324/427 |
| 4,968,942 | 11/1990 | Palanisamy | 324/430 |
| 5,115,182 | 5/1992 | Ehmke et al. | 320/14 |
| 5,184,408 | 2/1993 | Patino et al. | 320/15 |
| 5,200,689 | 4/1993 | Interiano et al. | |

FOREIGN PATENT DOCUMENTS

| | | |
|---|---|---|
| 0448755A1 | 10/1991 | European Pat. Off. . |
| 2219151 | 11/1989 | United Kingdom . |
| 2251515 | 7/1992 | United Kingdom . |
| WO92/22099 | 12/1992 | WIPO . |

OTHER PUBLICATIONS

Single Page, Preliminary Specification Sheet, Dallas Semiconductor.

*Primary Examiner*—Emanuel T. Voeltz
*Assistant Examiner*—Thomas Peeso
*Attorney, Agent, or Firm*—Sughrue, Mion, Zinn, Macpeak & Seas

[57] ABSTRACT

The present invention provides a system for recognizing and managing electrochemical cells connected to an application, the system being characterized by the fact that it comprises an electronic memory associated with the cells, and circuitry for reading from the memory and writing in the memory, the read write circuitry being placed in the application, the electronic memory comprising a non-erasable first portion containing information enabling the cell to be identified, and a second portion which may be modified or erased, and which contains information about the operation and the state of the cell.

9 Claims, 1 Drawing Sheet

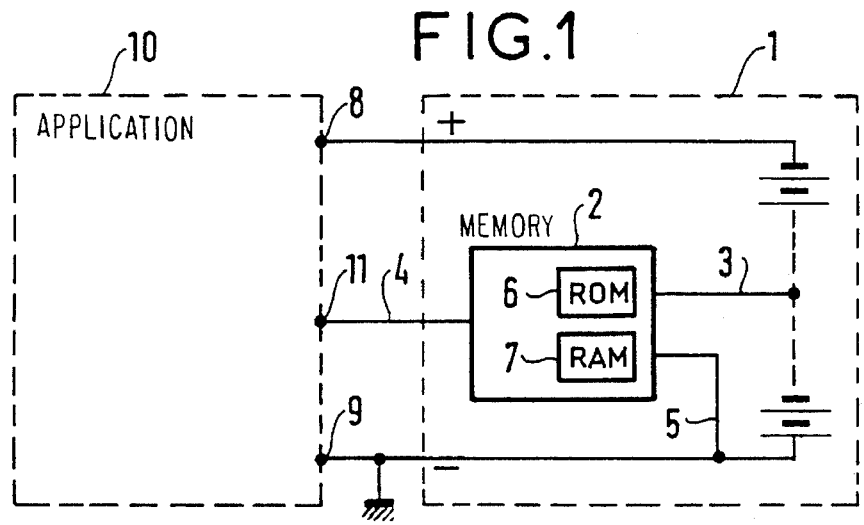
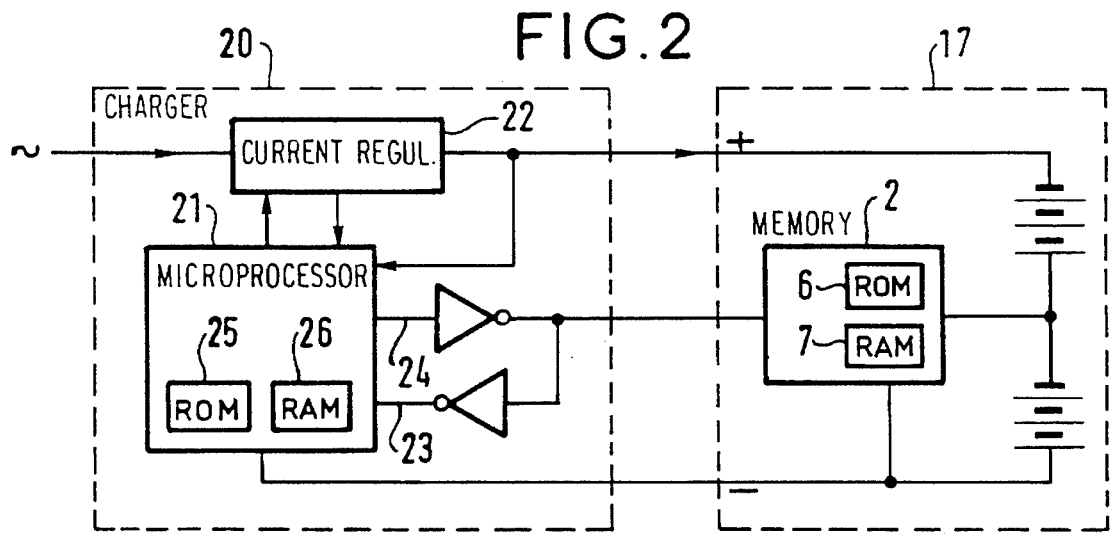
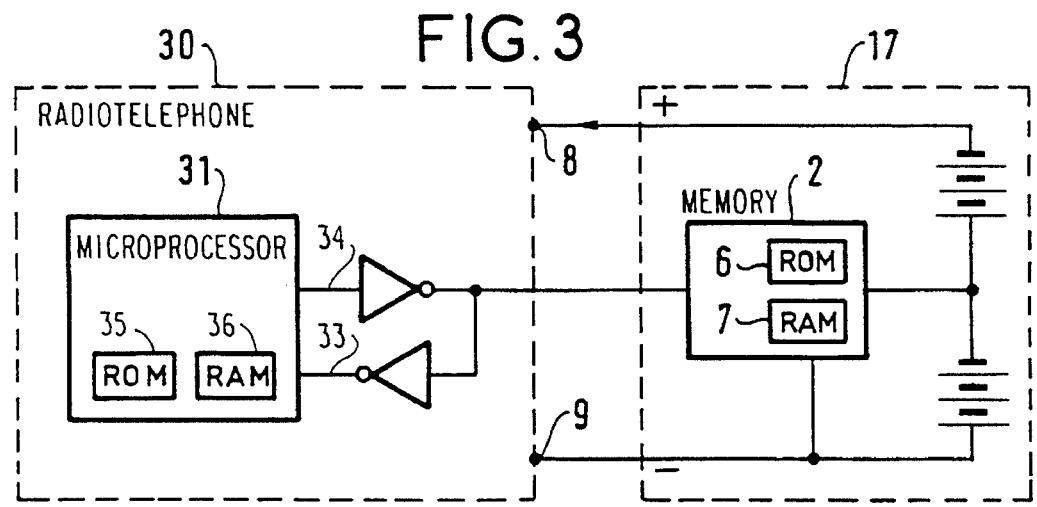

SYSTEM FOR RECOGNIZING AND MANAGING ELECTROCHEMICAL CELLS

BACKGROUND OF THE INVENTION

The present invention relates to a recognition and management system that is more particularly intended for electrochemical cells, which cells are generally associated together to form a battery.

Using electrochemical cells, in particular in portable applications, poses the problem of how to find out accurately the available capacities of the cells and the degree of aging thereof, since the performance levels of the cells decrease with use. Mere voltage measurement does not enable the charge level of an electrochemical cell to be determined correctly.

With a battery of storage cells used in a portable video camera, a solution that has been proposed is to monitor the state of charge by taking a coulometric measurement which takes self-discharge into account. The apparatus used to perform such monitoring and associated with the battery includes a 4-bit microcontroller, and it is capable of detecting the end of charging and the end of discharging so as to establish a set point. But that solution solves the problem posed in part only, and that apparatus involves considerable extra cost.

Furthermore, in theory, it is possible to make applications operate with electrochemical cells of different types or origins. In practice, this poses numerous problems due to different electrical characteristics (voltage, internal impedance, etc.), and often it results in a reduction in the performance levels of the electrochemical cell, and sometimes it does not even work at all. For a rechargeable electrochemical cell, the consequences are much more serious if the application is a charger, because a rechargeable electrochemical cell that is not charged properly may be rapidly degraded, thereby giving rise to major risks with respect to safety (explosion, fire, etc.).

To avoid charging primary electrochemical cells, mechanical identifying means are provided that are recognized by the charger and that inhibit charging. Identifying means (resistors, diodes, etc.) for identifying the type of cell so as to adapt the charging conditions thereto are also mentioned, e.g. in British Patent Applications GB-2 219 151 and GB-2 251 515, or in U.S. Pat. No. 5,200,689. But that technique can only be used for a family of products coming from the same manufacturer.

Patent JP-4 255 431 proposes a charger that is capable of taking a voltage measurement to determine the type of rechargeable electrochemical cell constituting the battery, so as to apply the appropriate charging current. That method is applicable only to rechargeable electrochemical batteries in which the number of cells connected in series is known, and which require slow charging. By a mere voltage measurement, it is impossible to determine whether or not the rechargeable electrochemical cell is designed to withstand fast charging.

European Patent Application EP-0 448 755 proposes to store information about the type of the cell in a nonvolatile RAM. That memory may be modified or erased intentionally or accidentally, which means that the cell can no longer be used under appropriate conditions.

Moreover, most known systems, e.g. such as the system described in Patent WO-92 22099, also include microprocessors which are complex and costly systems, and which consume a lot of energy.

SUMMARY OF THE INVENTION

A particular object of the invention is to provide a system enabling an application to identify the type and the characteristics of the electrochemical cells which are connected to it, without any risk of that information being lost while the cell is in use. Another object of the invention is to provide a system that makes it possible to find out the state of charge and the degree of aging of the cells, and to manage the discharging and recharging conditions of rechargeable electrochemical cells.

The present invention provides a system for recognizing and managing an electrochemical cell connected to an application, said system being characterized by the fact that it comprises an electronic memory associated with said cell, and read means for reading from said memory and write means for writing in said memory, said read means and said write means being placed in said application, said electronic memory comprising a non-erasable first portion containing information enabling said cell to be identified, and a second portion which may be modified or erased, and which contains information about the operation and the state of said cell.

The electronic memory comprises a first portion which is intended to be read-only and which contains data that is specific to the cell, and a second portion which is intended to be read, modified, and erased so as to keep up to date with developments in the characteristics of the cell as it ages.

More particularly, the first portion of the memory is intended to contain information given by the manufacturer to enable the electrochemical cell to be identified (description, operating conditions, etc.). Preferably, such information is written in the first portion by the manufacturer. In such a case, the first portion of the memory may be of the ROM-type (Read-Only Memory). But data may be added by the user, in which case the first portion of the memory is of the EPROM-type (Electrically Programmable Read-Only Memory). Such memories are non-erasable, which means that the data contained in them cannot be erased either intentionally or accidentally while the memories are in use. The information contained in such memories can never be modified.

In an embodiment of the present invention, the first portion of the memory contains at least one encoded item of data chosen from the following items of data:

type of the electrochemical couple;

nominal voltage (V);

nominal capacity (Ah);

rechargeability;

maximum and minimum (safety) voltage thresholds;

self-discharge (% per month);

reference of the product; and name of the manufacturer, etc.;

but also, for example, for a rechargeable cell:

charging mode, etc.

The second portion of the memory contains information about the operation and the state of the electrochemical cell. Such information is updated during the course of the life of the cell. The second portion serves to provide bi-directional data transfer, via the cell, between applications: charger, mobile load, etc. The term "load" designates herein any apparatus consuming electrical current supplied by the cell.

The memory used for that purpose may be of the RAM-type (Random Access Memory), or of the EEPROM type (Electrically Erasable Programmable Read-Only Memory).

Read access and write access to the memory may take place via a serial link or a parallel link. It is also possible to associate a real-time clock with the memory for calculating the self-discharge of the cell.

In another embodiment of the invention, the second portion of the memory contains at least one encoded item of data chosen from the following items of data about the electrochemical cell:

instantaneous capacity (at the time of the measurement);

updated nominal capacity taking into account the aging of the cell; and cumulative discharged capacity, etc;

but also, by way of example, for a rechargeable cell:

number of cycles already effected; and most recent date on which the cell was charged, etc.

The minimum condition for such a system to operate is that the applications have the capacity to communicate with the memory.

The read means enable the application to become informed of the data contained in the memory of the electrochemical cell and to adapt its operation. For example, the charger using the invention is capable of charging, effectively and safely, any type rechargeable electrochemical cell that it has identified. The charger may also refuse to charge a primary electrochemical cell or an electrochemical system that it does not recognize.

The write means enable the application to modify the data contained in said second portion of the memory of the electrochemical cell, and to write additional data therein. For example, once charging is finished, the charger writes in the second portion of the memory the quantity of electricity put into the rechargeable electrochemical cell. During discharging, the load deducts the quantity consumed. On the next occasion on which the cell is charged, the charger calculates by subtraction the quantity of electricity that it needs to supply to the cell.

With the second portion of the memory, it is also possible to keep up to date with developments in the characteristics of the electrochemical cells, such as nominal capacity, self-discharge, etc. For example, for rechargeable electrochemical cells, the charger may perform capacity tests (deep discharge) periodically and automatically, and it may write the results of such tests in the second portion of the memory.

The recognition and management system of the invention is designed to be used when electrochemical cells are connected to a mobile load such as a portable telephone, a handheld tool, a toy, a portable video camera, an electrical vehicle, etc. For example, the load reads the available capacity of the electrochemical cells from the second portion of the memory, and it then writes therein the quantity of electricity consumed and the date of the discharge. With rechargeable electrochemical cells, this information enables the following charging operation to be reinitialized correctly.

The recognition and management system of the invention is also designed to be used when rechargeable electrochemical cells are connected to a charger. The charger is provided with a microprocessor which can set the appropriate charging conditions on the basis of data read from the electronic memory of the rechargeable electrochemical cells. Charging is personalized by reading from the first portion of the memory, and this enables the charger to accept any type of rechargeable electrochemical cell. The information contained in the second portion of the memory is modified by the charger so as to integrate therein the developments in the characteristics of the rechargeable electrochemical cells following the charging operation.

BRIEF DESCRIPTION OF THE DRAWINGS

The invention will be better understood and other advantages and features will appear on reading the following description of embodiments given by way of non-limiting example and with reference to the accompanying drawings, in which:

FIG. 1 is a simplified circuit diagram of a battery of electrochemical cells, the battery including an electronic memory and being connected to an application;

FIG. 2 shows the configuration of the system of the invention when a battery of rechargeable electrochemical cells is connected to a charger; and FIG. 3 is analogous to FIG. 2 except that the battery of rechargeable electrochemical cells is connected to a portable radiotelephone.

DETAILED DESCRIPTION OF THE INVENTION

For example, the electronic memory 2 placed in a battery of electrochemical cells 1, as shown in FIG. 1, may be a memory of the "EconoRAM" type sold by Dallas Semiconductors. It has a capacity of 256 bits including 32 bits of ROM-type memory 6, with the remaining 224 bits being of RAM-type memory 7. The electronic memory 2 is in the form of a plastics housing and the three wires projecting therefrom comprise a positive power supply wire 3, a serial data input/output wire 4, and a wire 5 connected to ground. Wires 3 and 5 are connected to the power supply terminals 8 and 9 of the application 10, and wire 4 is connected to terminal 11. The consumption of the memory is 1 nA, and its power supply voltage lies in the range 1.2 V to 5.5 V. The data allocation in the ROM-type first portion 6 of the memory 2 is as follows:

| | |
|---|---|
| bits 1 to 3: | type of the electrochemical couple (8 possibilities): <br> 0 nickel-cadmium; <br> 1 nickel-hydride; <br> 2 nickel-zinc; <br> 3 lead-acid; <br> 4 zinc-alkaline manganese dioxide; <br> 5 to 7 lithium cells; |
| bit 4: | rechargeability of the cell: <br> 0 non-rechargeable; <br> 1 rechargeable; |
| bits 5 to 8: | number of cells in the battery (from 1 to 16); |
| bits 9 to 16: | voltage per cell (from 1 V to 4 V, in steps of 12 mV); this represents 8 bits, i.e. 255 usable combinations; the voltage U of each cell is then expressed by the following formula: <br> $U = 1 + x(3/255)$, where $0 \leqq x \leqq 255$; |
| bits 17 to 24: | capacity C of each cell, likewise: (from 50 mAh to 12.8 Ah, in steps of 50 mAh): <br> $C(mAh) = 50 + x50$, where $0 \leqq x \leqq 255$; |
| bits 25 & 26: | rated charging: <br> 0 C/10; <br> 1 C/5; <br> 2 C; <br> 3 4C; |
| bits 27 & 28: | charging mode: <br> 0 constant current; <br> 1 constant voltage; <br> 2 pulsating current; <br> 3 other mode; and |
| bits 29 to 32: | manufacturer code (16 possibilities). |

Other data such as the safety thresholds for voltage, for temperature, and for time may also be inserted, either by replacing some of the above data, or else by merely adding said other data, if a higher capacity ROM is used.

The data allocation in the RAM-type second portion 7 of the memory is as follows:

bits 33 to 40: number of occasions on which the battery has been fully charged since it was first put into service (from 0 to 2,550):

N=x10, where $0 \leq x \leq 255$;

bits 41 to 48: available capacity in the charged state (this varies with aging):

Q (mAh)=50=x50, where $0 \leq x \leq 255$;

bits 49 to 56: available capacity (state of charge):

D (mAh)=50+x50, where $0 \leq x \leq 255$;

bits 57 to 64: cumulative capacity since the battery was first put into service:

K (mAh)=50+x50, where $0 \leq x \leq 255$;

bits 65 to 71: self-discharge (% per month from 1% to 127%):

bits 72 to 85: most recent date on which the battery was fully charged:

bits 72 to 76: day 1 to day 31;
  bits 77 to 80: month 1 to month 12;
  bits 81 to 85: year 1993 to year 2024; and bits 86 to 255: free for other purposes.

EXAMPLE 1

As shown in FIG. 2, a memory 2 analogous to the memory described above was placed in a battery of rechargeable electrochemical cells, the battery being composed of 6 spiral-wound cylindrical nickel-cadmium storage cells of AA format (diameter: 14.3 mm, height: 50.3 mm), and sold by SAFT under the reference VR.

In this case, the contents of the ROM first portion 6 of the memory 2 was as follows:

| bits 1 to 3   | 000      | nickel-cadmium;      |
|---------------|----------|----------------------|
| bit 4         | 1        | rechargeable;        |
| bits 5 to 8   | 110      | 6 cells              |
| bits 9 to 16  | 00010001 | 1.2 Volts/storage cell |
| bits 17 to 24 | 00001010 | 550 mAh              |
| bits 25 and 26| 10       | charge current C     |
| bits 27 and 28| 00       | constant current     |
| bits 29 to 32 | 0000     | SAFT                 |

When in use, the RAM second portion 7 was managed by a charger and by a load.

The battery 17 of rechargeable electrochemical cells was connected to a charger 10. The charger 10 was provided with a microprocessor 11 which used the information contained in the memory 2 of the battery 17 to configure the current regulation module 12. The configuration related to the data contained in the ROM portion 6 of the memory 2, such as:

the charging current (C);

settings of the safety thresholds for voltage, temperature, and time; and the charging mode: constant current, etc.;

and to the data contained in the RAM portion 7 of the memory 2, such as:

the updated nominal capacity;

the number of cycles; and the most recent date on which the battery was charged, etc.

Firstly, the instantaneous capacity was measured by coulometry, it was then recorded cyclically by the microprocessor 11, and finally it was transferred to the second portion 7 of the memory 2 of the battery 17.

The microprocessor 11 had:

a converter for converting analog data into digital data, the converter making it possible to read the analog data required for managing charging (temperature, voltage);

a time counter for managing the charging time;

safety means (a watchdog);

a reception input 13 (RXD) and a transmission input 14 (TXD);

a ROM portion 15 and a RAM portion 26 for processing the software; and the microprocessor was controlled by an 11 MHz clock.

By way of example, the microprocessor was a circuit sold by SGS Thomson under the reference ST6210, which circuit includes 8 bits.

EXAMPLE 2

A battery 17 of rechargeable electrochemical cells including an electronic memory 2 analogous to the memory described in example 1 was connected to the power supply terminals 8 and 9 of a portable radiotelephone 20 of the GSM type (Global System for Mobile Communications), as shown in FIG. 3. The radiotelephone 20 was provided with a microprocessor 21 which communicated with the memory 2 of the battery 17 by writing therein the quantity of electricity consumed and the end-of-discharge date. By way of example, the microprocessor was of the 93C101 type sold by Philips.

The information written by the microprocessor in the memory of the battery made it possible for the charger 10, analogous to the charger described in example 3, to calculate the quantity of electricity required to recharge the battery 17 fully, on the following occasion on which the battery was charged. In this case, it was possible for the charger to be integrated into the radiotelephone.

EXAMPLE 3

A memory, analogous to the above-described memory, was placed in a battery of primary electrochemical cells, the battery being composed of 5 zinc-manganese dioxide primary cells having an alkaline electrolyte and being of R14 format (height: 50 mm, diameter: 26 mm), sold by Duracell under the reference MN 1400.

In this case, the contents of the ROM first portion of the memory was as follows:

| bits 1 to 3   | 010      | alkaline Zn—$MnO_2$ |
|---------------|----------|---------------------|
| bit 4         | 0        | primary             |
| bits 5 to 8   | 0101     | 5 cells             |
| bits 9 to 16  | 00101010 | 1.5 volts/cell      |
| bits 17 to 24 | 01101101 | 5,500 mAh           |
| bits 25 & 26  | not used |                     |
| bits 27 & 28  | not used |                     |
| bits 29 to 32 | 0001     | Duracell            |

The RAM second portion 7 was managed in use by a load.

The battery of primary electrochemical cells was connected to the power supply terminals of a portable video camera provided with a microprocessor which communicated with the memory of the battery by writing therein the quantity of electricity consumed, and the end-of-discharge date. On the following occasion on which the battery was discharged, the information written in the memory of the battery by the microprocessor informed the camera of the remaining available quantity of electricity.

Naturally, the present invention is not limited to the embodiments described and shown, and many variants accessible to a person skilled in the art are possible without going beyond the spirit of the invention. In particular, any means may be replaced with equivalent means without going beyond the ambit of the invention.

I claim:

1. A system for managing the use of a battery connected to a device, said battery including at least one electrochemical cell, said system comprising:

an electronic memory incorporated in said battery, said electronic memory comprising a non-erasable first portion containing information identifying said battery, with at least some of said information being written by a user of said battery, and a second portion which may be modified or erased and which contains information about the operation and the state of said battery, read means for reading from said memory and write means for writing in said memory, and circuitry in said device for managing the use of said battery in accordance with information about said cell read from said cell, and said system.

2. A system according to claim 1, wherein said first portion of the memory contains data written by a manufacturer of said cell.

3. A system according to claim 1, wherein said first portion of the memory contains data written by a user of said cell.

4. A system according to claim 1, wherein said first portion of the memory of said electrochemical cell contains at least one item of data chosen from the following items of data:

type of the electrochemical couple;

nominal voltage;

nominal capacity;

rechargeability;

maximum and minimum voltage thresholds;

self-discharge;

reference of the product; and name of the manufacturer.

5. A system according to claim 1, wherein said second portion of the memory of said electrochemical cell contains at least one item of data chosen from the following items of data:

instantaneous capacity;

updated nominal capacity; and cumulative discharged capacity.

6. A system according to claim 1, wherein said read means enable the device to become informed of the data contained in said memory and to adapt the operation of the device to the conditions of the electrochemical cell.

7. A system according to claim 1, wherein said write means enable the device to modify the data contained in said second portion of the memory, and to write additional data therein.

8. A system according to claim 1, wherein said device is a mobile load that consumes current supplied by said electrochemical cell.

9. A system according to claim 1, wherein said device is a charger and said electrochemical cell is rechargeable.

* * * * *